United States Patent [19]
Suzuki et al.

[11] Patent Number: 5,543,353
[45] Date of Patent: Aug. 6, 1996

[54] METHOD OF MANUFACTURING A SEMICONDUCTOR PHOTONIC INTEGRATED CIRCUIT

[75] Inventors: Makoto Suzuki; Masahiro Aoki; Makoto Takahashi, all of Kokubunji; Tsuyoshi Taniwatari, Hachioji, all of Japan

[73] Assignee: Hitachi, Ltd., Tokyo, Japan

[21] Appl. No.: 282,587

[22] Filed: Jul. 29, 1994

[30] Foreign Application Priority Data

Aug. 4, 1993 [JP] Japan .................................. 5-193491

[51] Int. Cl.⁶ .................................................. H01L 21/20
[52] U.S. Cl. ........................... 437/127; 437/129; 437/133
[58] Field of Search .................................... 437/129, 133, 437/126, 127

[56] References Cited

U.S. PATENT DOCUMENTS

| | | | |
|---|---|---|---|
| 5,019,519 | 5/1991 | Tanaka et al. | 437/129 |
| 5,147,825 | 9/1992 | Koch et al. | 437/228 |

FOREIGN PATENT DOCUMENTS

| | | |
|---|---|---|
| 558089 | 9/1993 | European Pat. Off. . |
| 5-29602 | 2/1993 | Japan . |

OTHER PUBLICATIONS

Central Research Laboratory, Hitachi Ltd.; M. Aoki et al. (1992): *An MQW-EA modulator/DFB laser integrated lightsource fabricated by in-plane Eg control in selective area MOCVD growth.*

T. Sasaki et al.; Opto-Electronics Research Lab., NEC Corporation, p. 4–161 (1991): *Application of MOVPE Selective Growth to Photonic Devices.*

*Primary Examiner*—R. Bruce Breneman
*Assistant Examiner*—Linda J. Fleck
*Attorney, Agent, or Firm*—Kenyon & Kenyon

[57] ABSTRACT

A semiconductor photonic integrated circuit and a manufacturing method thereof involving a selective-area growth technique using a set of insulating film patterning masks formed on a semiconductor substrate. The mask width and the mask-to-mask open space width are variable but numerically limited. A single crystal growth process is carried out to form on the same substrate a plurality of contiguous bulk semiconductor layers or quantum well layers differing from one another in terms of growth layer thickness or composition. The differences in energy level between these layers are utilized so that semiconductor photonic integrated devices of different functions are formed on the substrate.

6 Claims, 11 Drawing Sheets

FIG. 6
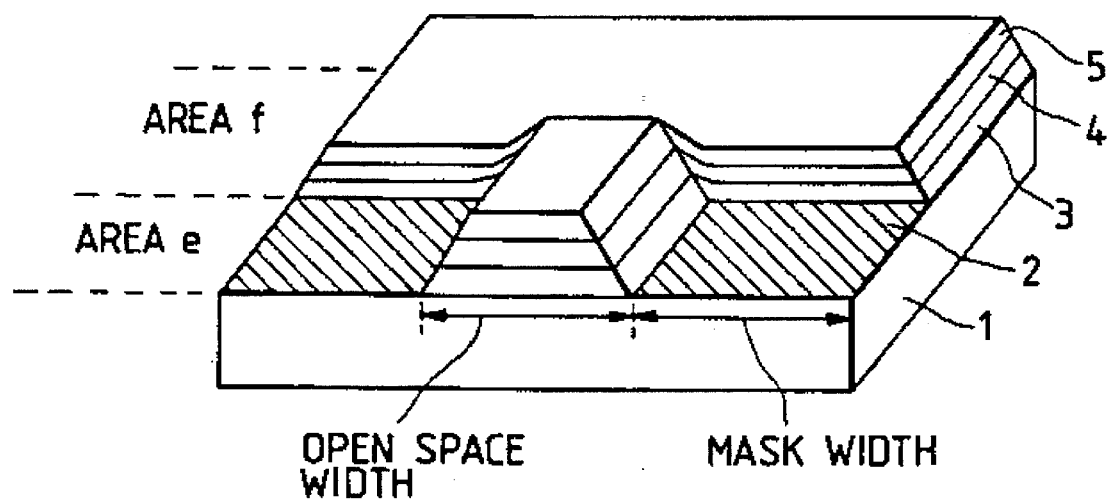
AREA f
AREA e
OPEN SPACE WIDTH
MASK WIDTH
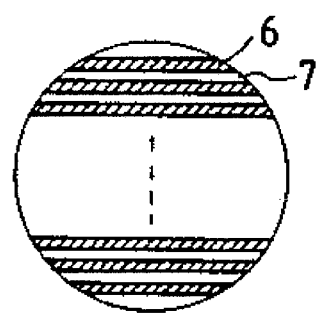
FIG. 6A

FIG. 9A  $\lambda_{PL} \approx 1.45\,\mu m$

FIG. 9B  $\lambda_{PL} \approx 1.55\,\mu m$ $\lambda_{PL} \approx 1.42 \mu m$    $\lambda_{PL} \approx 1.55 \mu m$

FIG. IIA    FIG. IIB $\lambda_{PL} \approx 1.55 \mu m$    $\lambda_{PL} \approx 1.25 \mu m$ $\lambda_{PL} \approx 1.55 \mu m$    $\lambda_{PL} \approx 1.60 \mu m$

METHOD OF MANUFACTURING A SEMICONDUCTOR PHOTONIC INTEGRATED CIRCUIT

BACKGROUND OF THE INVENTION

This invention relates to a semiconductor photonic integrated circuit and a manufacturing method thereof. More particularly, the invention relates to a semiconductor photonic integrated circuit which, formed on the same substrate, comprises semiconductor photonic devices of different functions, and to a manufacturing method of the semiconductor photonic integrated circuit involving a selective-area growth technique using an insulating film patterning mask.

There exists what is known as the selective-area growth technique that utilizes insulating film patterning masks in integrally fabricating, on the same semiconductor substrate, such semiconductor photonic devices as the semiconductor laser, optical modulator, optical switch, photo-detector and optical amplifier of different functions. The selective-area growth technique involves primarily forming insulating film patterning masks over the semiconductor substrate so as to permit vapor phase growth of semiconductor crystals in unmasked, i.e., exposed areas of the substrate. During manufacture of target semiconductor photonic devices, the width of the insulating film mask and that of the exposed area over the semiconductor substrate are varied in the light transmission direction of these devices, and vapor phase growth of an alloy semiconductor is effected. This causes alloy semiconductor layers of different growth layer compositions and of different layer thicknesses to be formed automatically in the same process and in accordance with the width of the insulating film mask and that of the exposed area. This is because the density gradient in vapor phase of various materials that contain the atoms constituting alloy semiconductor crystals, and the effective surface migration length involved, vary from material to material. The selective-area technique process thus allows the semiconductor laser, optical modulator and other semiconductor photonic devices of different functions to be formed on the same semiconductor substrate in the same process. The photonic devices so formed have good optical coupling therebetween.

Literature on the manufacture of semiconductor photonic integrated circuits based on the selective-area growth technique includes illustratively the 1991 and 1992 transactions of the Institute of Electronics, Information and Communication Engineers of Japan (C-131 and C-178 respectively from the general meetings of autumn 1991 and spring 1992), and Japanese Patent Application No. Hei 3-180746.

It has been found that, for conventional manufacture of a plurality of growth layers of different thicknesses and different compositions, it has been found that the more the periods of quantum well active layers (i.e., the larger the number of repetitions of quantum wells), the less pronounced the quantum effect due to the nonuniformity in growth layer structure and composition. This has led to degraded characteristics of the semiconductor photonic integrated devices eventually manufactured. Another conventional finding is that, when the growth layers formed by the selective-area growth process are formed into mesa-stripes by etching and then into current block layers and the like by means of buried growth, the fabrication yield tends to drop. This is because the process of photolithography requires high levels of alignment precision so that the irregular layer thicknesses and compositions of the growth layers are taken into account.

What follows is a more detailed description of the foregoing aspects of the prior art with reference to the accompanying drawings. In FIG. 1A, an insulating film mask 2 whose width varies in the optical axis direction is formed on a semiconductor substrate 1 to effect partially vapor phase growth of an alloy semiconductor. Here, the density gradient in vapor phase of various materials that contain the atoms constituting alloy semiconductor crystals, and the effective surface migration length involved, vary from one material to another. This causes semiconductor layers 3, 4 and 5 of different compositions and thicknesses to be formed according to mask width. As shown in FIG. 1D, a cross-sectional view taken on line X–X' in FIG. 1A, areas a-1 and a-2 have a very smooth transition area therebetween because their crystals were made to grow in the same fabrication process. The structure provides high levels of optical coupling efficiency between semiconductor photonic devices of different functions formed in different areas of the substrate.

In growing the quantum well active layer 4, suppose that an open space width between masks is narrowed (illustratively to about 2 μm). In that case, as depicted in FIG. 1B, even if the growth time of quantum well layers 6 (InGaAs) and that of barrier layers (InGaAsP) 7 within the quantum well active layer 4 are made constant, the layers 6 and 7 tend to vary in terms of film thickness and composition in the direction of their growth.

Suppose then that the open space width between the masks is widened (illustratively to about 80 μm). In that case, as shown in FIG. 1C, the film thickness and the composition of the layers 6 and 7 are non-uniform in the direction of planes perpendicular to the optical axis inside the alloy semiconductor layers. The closer the layer to the mask, the greater the film thickness thereof; the closer the layer to the mask, the higher the In content thereof. Larger numbers of periods of quantum wells thus entail growing degrees of nonuniformity in the layer structure and composition. As a result, the quantum size effect involved is lessened, and the characteristics of the semiconductor photonic integrated circuit devices are reduced. As shown in FIG. 1C, the distribution of emission wavelengths in the quantum well active layer is arcuate in the direction of planes perpendicular to the optical axis. The closer the layer to the masks, the farther the wavelength is red-shifted. Compared with the case where the crystals are grown on an unmasked substrate, the full width at half Maimum (FWHM) in luminescence from quantum wells is increased and the device performance is lowered. Furthermore, when the growth layer formed as described is etched into mesa-stripes about 1 μm wide, a slight misalignment that may occur varies the emission wavelength and degrades the fabrication yield.

SUMMARY OF THE INVENTION

It is therefore an object of this invention to provide a method of manufacturing a semiconductor photonic integrated circuit with growth layers of precise layer thicknesses and compositions, the circuit comprising a plurality of photonic devices formed integrally on a single substrate by use of the selective-area growth technique.

It is another object of this invention to provide a method of manufacturing a semiconductor photonic integrated circuit whereby the growth layers formed by the selective-area growth technique are formed into mesa-stripes and then into current block layers through buried growth, the manufacturing being conducted more easily and at a higher fabrication yield than before.

In achieving the foregoing and other objects of the invention and according to one aspect thereof, there is provided a method of manufacturing a semiconductor photonic integrated circuit comprising a plurality of photonic devices of different functions by use of a selective-area growth process which involves insulating film patterning masks formed on a semiconductor substrate, wherein the band-gap energy of a growth layer in a given location on the semiconductor substrate is controlled in the same crystal growth process. For this method, an optimum open space width is to be found between the insulating film patterning masks for forming an optical waveguide of at least one of the semiconductor photonic devices, as well as an optimum mask width. It is according to these optimum sizes that the semiconductor photonic devices are subsequently fabricated. Specifically, the open space width between the insulating film patterning masks is to be 10 through 30 μm, and the width between the insulating film patterning masks on both sides of the optical waveguide and perpendicular to the optical axis is to be between 16 and 800 μm.

The method of this invention for manufacturing a semiconductor photonic integrated circuit preferably includes a process of etching into mesa-stripes the growth layer formed by the selective-area growth process.

Semiconductor structures composed of growth layers that may be formed by the selective-area growth process include: a multi-quantum-well active layer structure having well layers of InGaAs and barrier layers of InGaAsP; a multi-quantum-well active layer structure with well layers of InGaAsP; and structures involving layers of such materials as InGaAlAs, GaAlAs, InAlAs, GaAlAsP, InAsP and GaAsP. Major photonic devices with different functions include the semiconductor laser, optical modulator, optical switch, photo-detector and optical amplifier.

When the open space width is set for 10 through 30 μm between the insulating film patterning masks for forming the optical waveguide, and the mask width for 16 through 800 μm, it is easy to form a quantum well active layer comprising well layers and barrier layers of uniform film thicknesses and compositions in the growth direction. It is also possible to obtain, for an optical waveguide having a quantum well active layer, a flat distribution of in-plane emission wavelengths in perpendicular relation to the optical axis. Furthermore, the conventional process of buried growth is carried out with ease. The above advantages of the inventive method make it possible to manufacture, easily and at a high level of fabrication yield, a semiconductor photonic integrated circuit comprising high-performance semiconductor photonic devices of quantum well structures formed integrally on the same substrate.

These and other objects, features and advantages of the invention will become more apparent upon a reading of the following description and appended drawings.

BRIEF DESCRIPTION OF THE DRAWINGS

FIG. 6 is a perspective view of a semiconductor light emitting element manufactured by a first embodiment of the manufacturing method according to this invention;

DESCRIPTION OF THE PREFERRED EMBODIMENTS

Figure 1A:
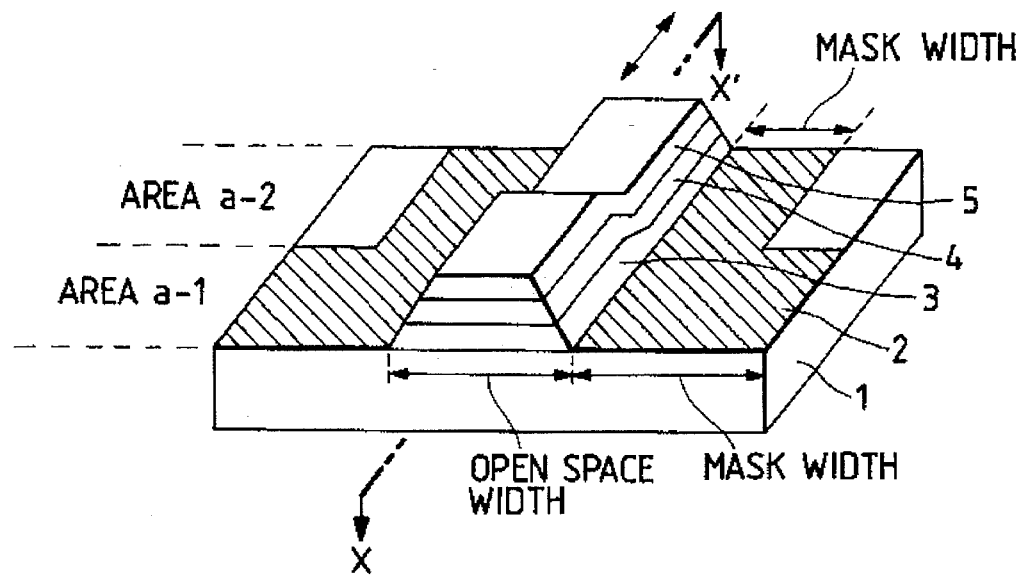
FIG. 1A is a perspective view of a conventional semiconductor device.
Figure 1B:
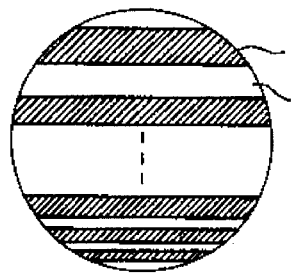
FIGS. 1B and 1C are partially magnified views of the conventional semiconductor device.
Figure 1C:
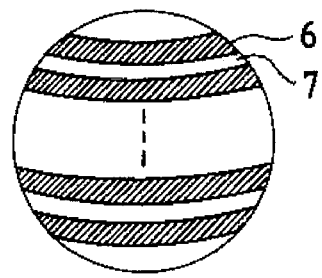
Figure 1D:
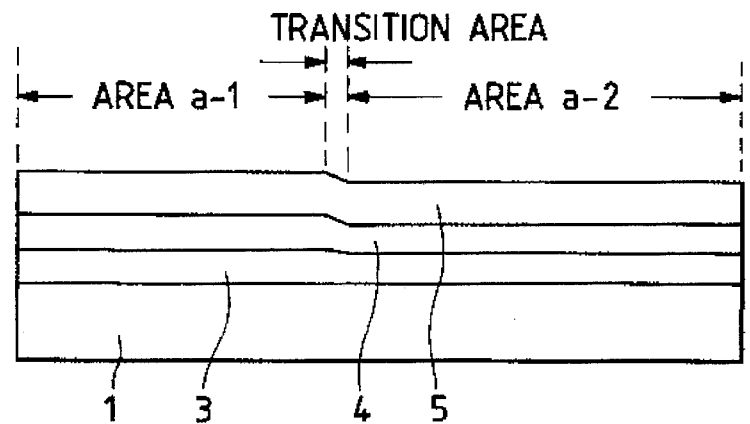
FIG. 1D is a cross-sectional view of the device in FIG. 1A.
Figure 2:
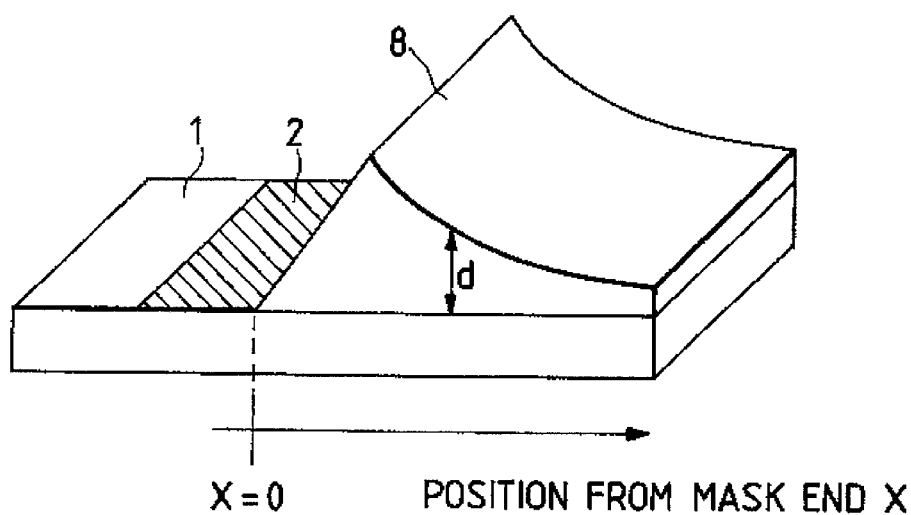
FIG. 2 is a view depicting an effect of this invention.

Referring to FIG. 2, an insulating film patterning mask 2 is formed on a semiconductor substrate 1, and an alloy semiconductor layer 8 is formed by the selective-area growth process. The film thickness d of the alloy semiconductor layer 8 is expressed as $$d = A \exp(-x/L) + d_0$$

where A represents a constant, L is the vapor phase diffusion length of the group III species, and $d_0$ represents the film thickness in a position sufficiently distant from the mask 2 and thus free of the influence of the mask. To control the thickness and composition of a growth layer requires that the open space width be less than the vapor diffusion length L between the masks for forming at least part of the photonic devices involved. According to this invention, the open space width between the masks is between 10 and 30 μm, i.e., well within a range of 1.0 to 0.125 times the vapor diffusion length L of the group III species, and the requirement above is satisfied.

For the thickness of a growth layer to be uniform requires that the open space width between the masks be 30 μm or less. Meanwhile, the open space width must be 10 μm or more to allow for the precision requirements regarding the alignment of electrodes, photo-resist and other parts during manufacture of the devices. Furthermore, the open space width should preferably be 5 μm or more in view of the strain involved (i.e., the amount of lattice mismatch) and of the increased growth rate in the growth direction. These requirements are also met by the open space width being 10 through 30 μm according to the invention.

Figure 3:
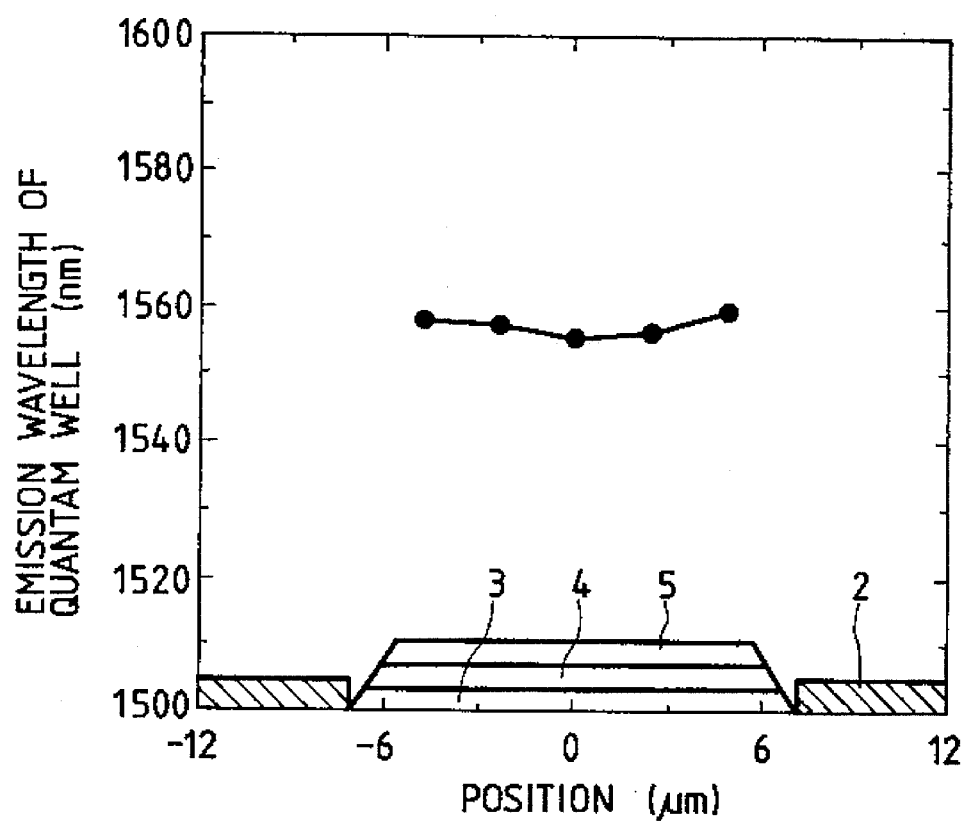
FIG. 3 is a graphic representation showing characteristics of a semiconductor photonic integrated circuit embodying the invention.

When the masks with the open space width of 10 through 30 μm therebetween are used to grow the alloy semiconductor in vapor phase on the substrate, the density distribution of the group III species on the substrate for the semiconductor photonic integrated circuit is uniform within the open space. The composition and the film thickness of the semiconductor layers 3, 4 and 5 formed selectively within the open space are distributed flatly in the direction of planes perpendicular to the optical axis. As a result, where the open space width between the masks is set to be 20 μm, with the quantum well active layer 4 comprising quantum well layers 6 of InGaAs and barrier layers 7 of InGaAsP, the emission wavelengths of the quantum well layers constitute a uniform distribution as depicted in FIG. 3.

The width of the insulating film patterning mask 2 for hampering the growth of layers is determined in accordance with the emission wavelength defined by the function of the semiconductor photonic device in question and open space width. During manufacture of light emitting elements, there is a process of forming the growth layer into mesa-stripes. In case of a mesa-stripe misalignment, the emission wavelengths remain stable, which boosts the fabrication yield. Because the emission wavelength is uniform in the lateral direction of mesa-stripes within a very small area, the device performance is not deteriorated. Since the open space width is sufficiently large compared with the growth film thickness, the masking effect stemming from the (111)B plane where it is difficult for crystals to grow is negligibly small. Thus the film thickness and composition of the quantum well layers 6 and barrier layers 7 are uniform in the growth direction. With the quantum size effect staying intact, the device performance is not degraded.

Figure 4:
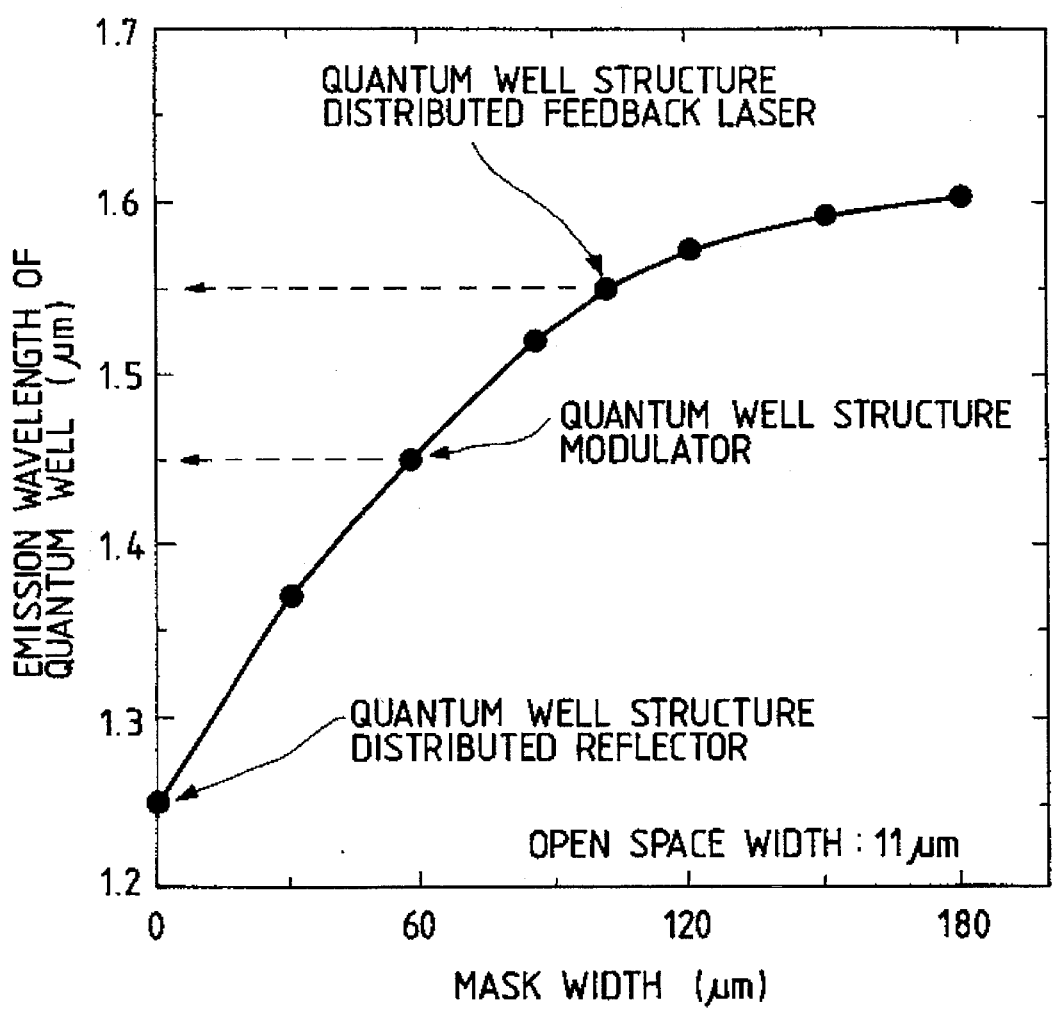
FIG. 4 is a graphic representation plotting the relationship between the mask width and the emission wavelength of the embodiment.

FIG. 4 is a graphic representation plotting the relationship between the patterning mask width and the emission wavelength in effect when, with such growth conditions as supply of source material and growth temperature kept constant, the quantum well active layer 4 is grown by metal organic vapor phase epitaxy. This example is constituted by three well layers 6 of InGaAs and four barrier layers 7 of InGaAsP. Depending on the combination of open space width and mask width, a quantum well structure is automatically formed with well layers and barrier layers of different growth layer thicknesses and compositions, and different quantum levels occur correspondingly. As shown in FIG. 4, determining different mask widths on the same substrate makes it possible to establish a plurality of emission wavelengths as desired.

Figure 5:
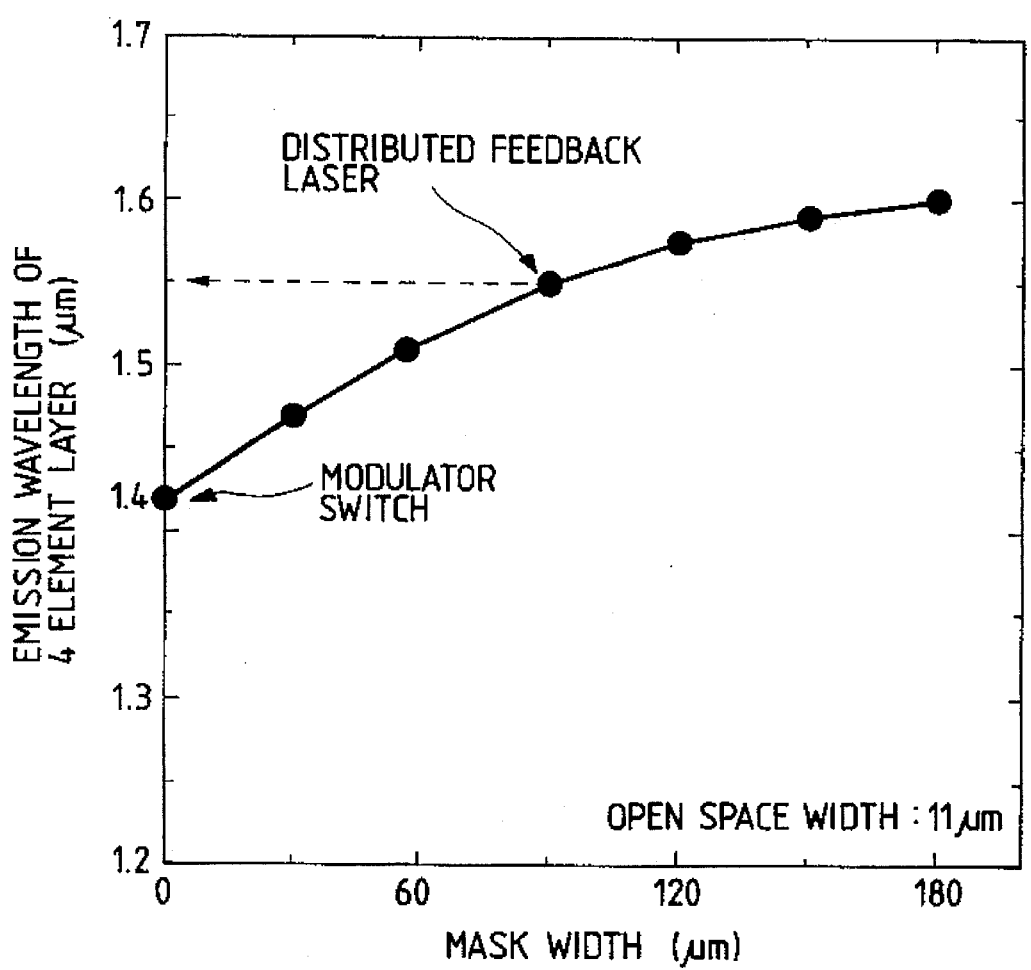
FIG. 5 is a graphic representation plotting the relationship between the mask width and the emission wavelength of another embodiment of this invention.

FIG. 5 is a graphic representation plotting the relationship between the patterning mask width and the emission wavelength in effect when active layers of InGaAsP are deposited. In the examples of FIGS. 4 and 5, the emission wavelength is set respectively for 1.25 μm and 1.42 μm, with the mask width at 0 μm (i.e., no mask furnished). Alternatively, the emission wavelength may be set as desired in accordance with the function of the semiconductor photonic device in question. With these two structures adopted, the waveguide layer on the narrow energy gap side may illustratively be used as a semiconductor light emitting element, and the waveguide layer on the wide energy gap side as a semiconductor passive element. That is, one crystal growth process readily permits a plurality of semiconductor photonic devices of different functions to be formed integrally on the same substrate.

What follows is a detailed description of the preferred embodiments of the manufacturing method according to this invention, with reference to the accompanying drawings.

First Embodiment

FIG. 6 is a perspective view of a semiconductor photonic integrated circuit manufactured by the first embodiment of the manufacturing method according to this invention. An insulating film patterning mask 2 having a width of 16 through 800 μm is formed in an area e of an n-InP substrate 1. No mask is furnished in an area f (mask width =0 μm). The open space width (growth area) for the patterning mask 2 ranges from 10 to 30 μm. On the patterning substrate 1, compound semiconductor alloys 3, 4 and 5 are deposited by metal organic vapor phase epitaxy. With the insulating film patterning mask 2 staying within the designated mask width and open space width, the quantum well layers 6 and barrier layers 7 in a multi-quantum-well active layer structure constituting the compound semiconductor alloy 4 are flat and uniform in thickness.

Second Embodiment

Figure 7A:
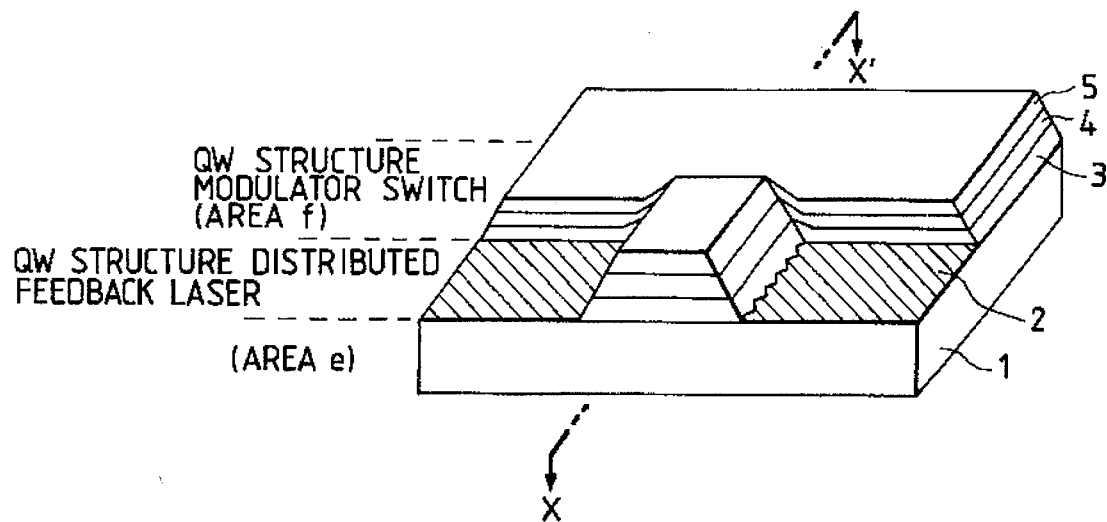
FIGS. 7A, 7B and 7C are perspective views of a semiconductor light emitting element manufactured by a second embodiment of the inventive manufacturing method.
Figure 7B:
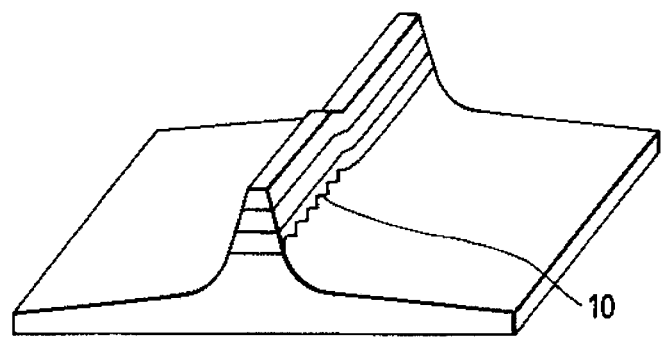
Figure 7C:
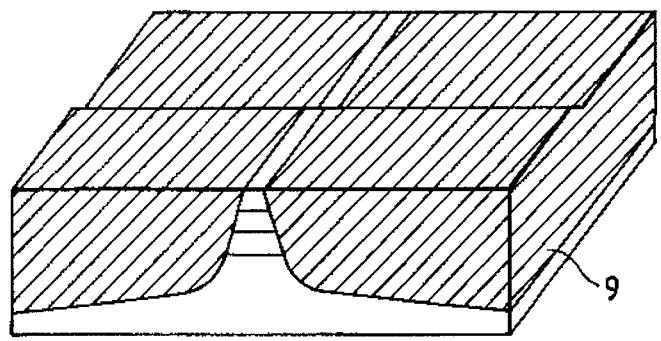
Figure 8:
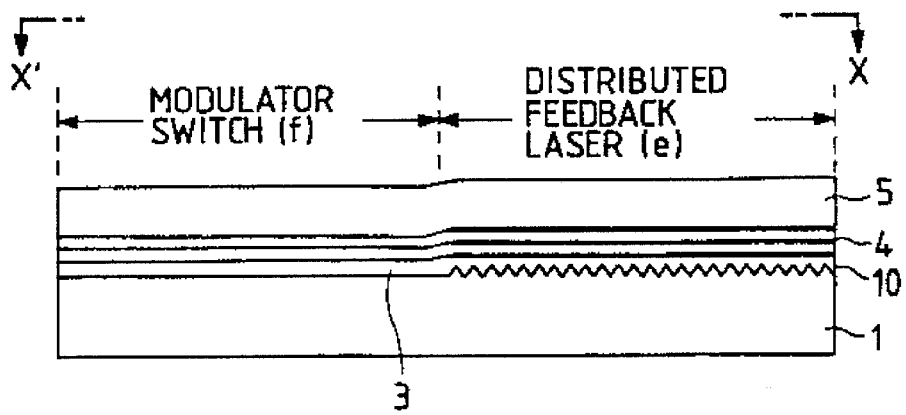
FIG. 8 is a cross-sectional view taken on line X–X' in the optical axis direction of FIG. 7A.

FIGS. 7A, 7B and 7C are perspective views of a semiconductor photonic integrated circuit manufactured by the second embodiment of the manufacturing method according to this invention. As shown in FIG. 7A, the patterning mask 2 composed of an insulator such as $SiO_2$, SiNx, etc. is formed in an area (e). This is effected so that the width of the region on the n-InP substrate 1 in which the semiconductor substrate is exposed (called an open space region) in the area (e) becomes different from that of the open space region in an area (f). Diffraction grating 10 is formed in the direction of the optical waveguide (X–X') in the area (e), but not in the area (f). The insulating film patterning mask 2 has a width of 16 to 800 μm and an open space width (growth area) of 10 to 30 μm. No insulating film patterning mask is provided in the area (f). On the semiconductor substrate 1 with the mask 2 deposited thereon, there are grown in crystals an InGaAsP, quaternary waveguide layer 3, a quantum well structure 4 and a p-InP clad layer 5 successively by metal organic vapor phase epitaxy. The quantum well structure 4 comprises InGaAs well layers 6 and InGaAsP barrier layers 7. In the areas (e) and (f) having different mask widths and different open space widths, there is automatically formed the quantum well structure 4 with quantum well layers and barrier layers of different layer thicknesses and compositions. Thus the quantum level of the quantum well structure in the area (e) is different from that in the area (f). This provides an optical waveguide structure of equivalently different band-gap wavelengths in the optical waveguide direction. FIG. 8 is a cross-sectional view taken on line X–X' in the optical axis direction of FIG. 7A.

Then follows the etching of the growth layers 3, 4 and 5 and part of the substrate 1 into mesa-stripes by use of a Br-based etchant, as shown in FIG. 7B. Thereafter, as depicted in FIG. 7C, buried growth of a current block layer 9 is carried out by the metal organic vapor phase epitaxy method, liquid phase epitaxy (LPE) method, chemical beam epitaxy (CBE) method, or metal organic molecular epitaxy (MOMBE) method.

It can be seen from FIG. 4 that gain peak wavelengths are set to 1.55 μm and 1.45 μm where the mask widths of the areas (e) and (f) are set to 100 μm and 55 μm, respectively. Where the areas (e) and (f) are used respectively as a distributed feedback laser and an optical modulator switch, high-performance semiconductor photonic integrated devices of high reliability are readily implemented thereby. According to the invention, the inclusion of the conventional buried growth process provides substantially the same productivity in manufacturing semiconductor photonic integrated circuits as in producing conventional discrete semiconductor laser devices.

Figure 9:
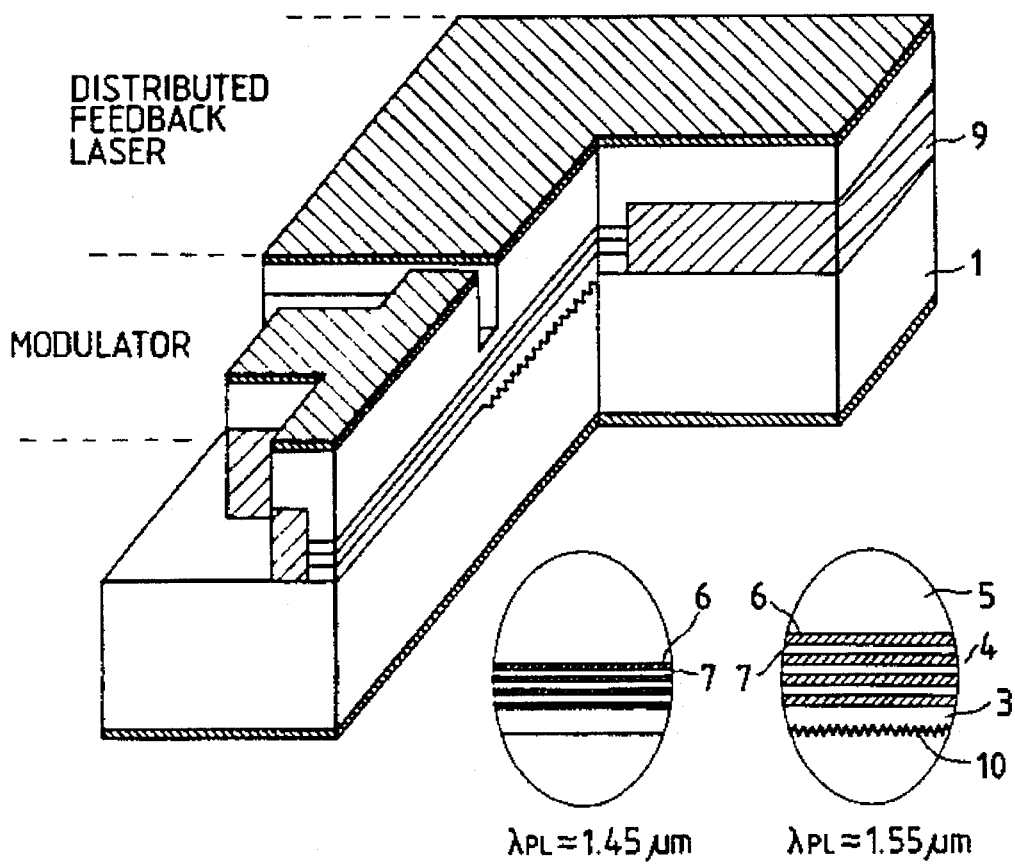
FIG. 9 is another perspective view of the semiconductor light emitting element manufactured by the second embodiment of the inventive manufacturing method.

FIG. 9 is another perspective view of the semiconductor photonic integrated circuit manufactured by the second embodiment of the manufacturing method according to this invention. The figure shows a buried structure and a device structure in effect after a current constrict structure has been introduced. Illustratively, if the buried structure comprises a current block layer made of an iron-doped InP semiconductor layer having a semi-insulating characteristic, the parasitic capacity involved is further reduced, and the modulation band of the semiconductor photonic integrated circuit is improved for high-speed modulation. In the multi-quantum-well active layer structure 4 inside the mesa of the semiconductor photonic integrated circuit in FIG. 9, the band-gap wavelength of the laser part differs from that of the modulator part. The band-gap wavelength is uniform in both the laser part and the modulator part with the exception of a transition region therebetween. For the laser part and the modulator part, the variation of the film thickness and composition between all quantum well layers as well as between barrier layers is 1% or less. Because the film thickness and composition of the quantum well layers and barrier layers are substantially constant in the growth direction within the multi-quantum-well active layer structure, the quantum size effect is fully exerted, and the semiconductor photonic integrated circuit in question provides good characteristics.

Third Embodiment

Figure 10:
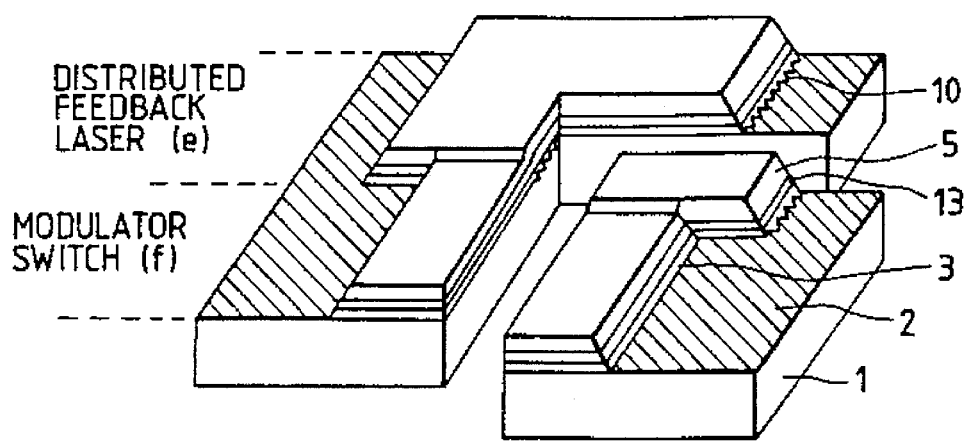
FIG. 10 is an exploded perspective view of a semiconductor light emitting element manufactured by a third embodiment of the inventive manufacturing method.

FIG. 10 is an exploded perspective view of a semiconductor photonic integrated circuit being manufactured at one stage of the third embodiment of the manufacturing method according to this invention. The illustrated example involves an InGaAsP active layer 13 replacing the quantum well structure 4 of InGaAs and InGaAsP manufactured by the second embodiment. This example has a quaternary crystal layer grown in open space regions, and the patterning mask width and mask-to-mask open space width are set as per the relationship in FIG. 5. That is, the mask widths are set to 90 μm and 0 μm for the areas (e) and (f), respectively. This in turn sets the gain peak wavelengths to 1.55 μm and 1.42 μm for the areas (e) and (f), allowing these areas to function as a distributed feedback laser and an optical modulator switch, respectively.

Figure 11:
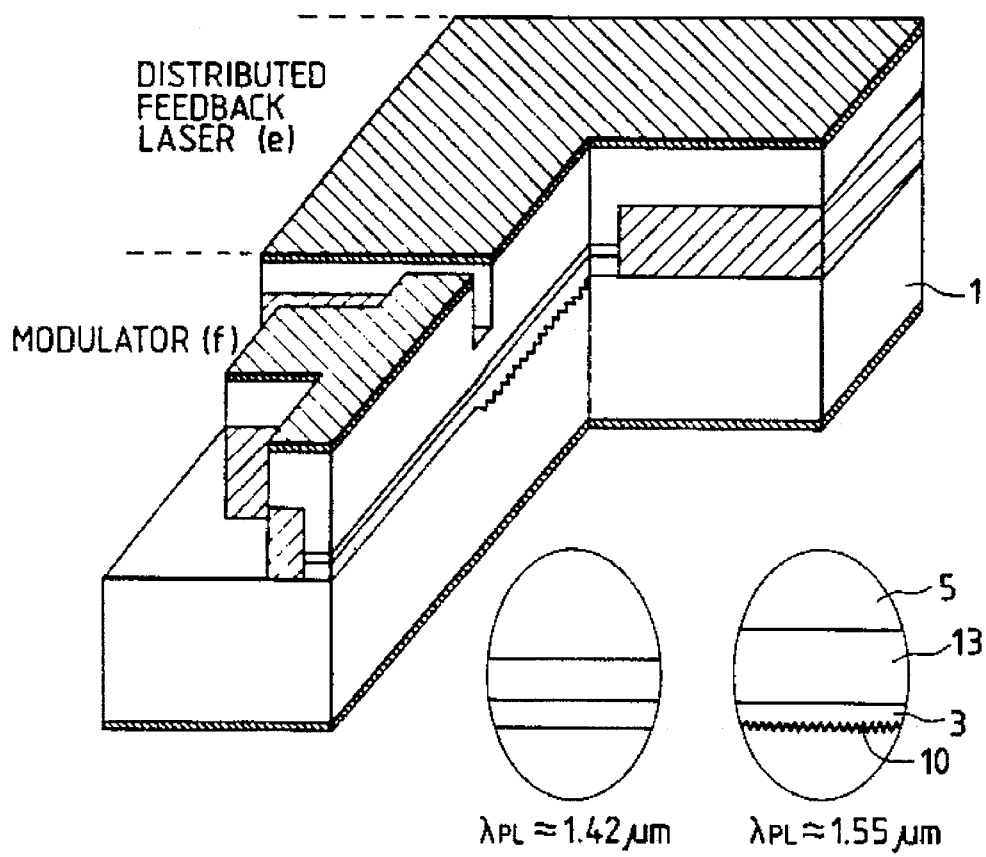
FIG. 11 is a perspective view of the FIG. 10 structure supplemented with a buried structure and a current constrict structure.

FIG. 11 is a perspective view of the FIG. 10 structure constituting a semiconductor photonic integrated circuit supplemented with a buried structure and a current constrict structure.

Fourth Embodiment

Figures 12, 12A, 12B:
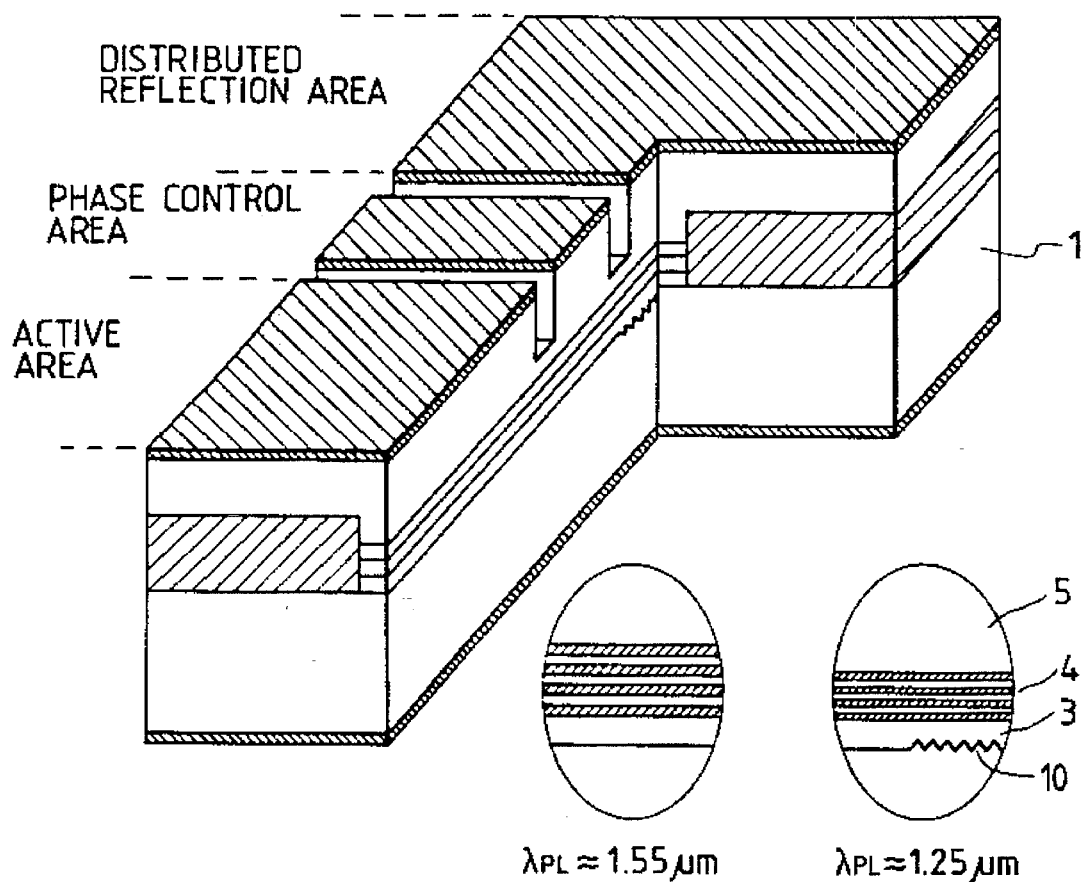
FIG. 12 is a perspective view of a semiconductor light emitting element manufactured by a fourth embodiment of the inventive manufacturing method.

FIG. 12 is a perspective view of a semiconductor photonic integrated circuit manufactured by the fourth embodiment of the manufacturing method according to this invention. The illustrated example involves diffraction grating 10 partially formed on the substrate 1. Over the n-InP substrate 1 covered with patterning masks, there are grown in crystals an InGaAsP waveguide layer 3, a quantum well structure 4 and a p-InP clad layer 5 successively by metal organic vapor phase epitaxy. The quantum well structure 4 comprises InGaAs well layers and InGaAsP barrier layers. As per the relationship in FIG. 4, the gain peak wavelengths are set to 1.55 μm and 1.25 μm where the mask widths are set to 100 μm and 0 μm, respectively. When this structure is divided for use into an active region, a phase control region and a passive distributed Bragg reflection region, these regions combine readily to constitute a wavelength-tunable distributed Bragg reflector laser featuring a narrow spectral linewidth, wide wavelength tuning and high reliability.

Fifth Embodiment

Figures 13, 13A, 13B:
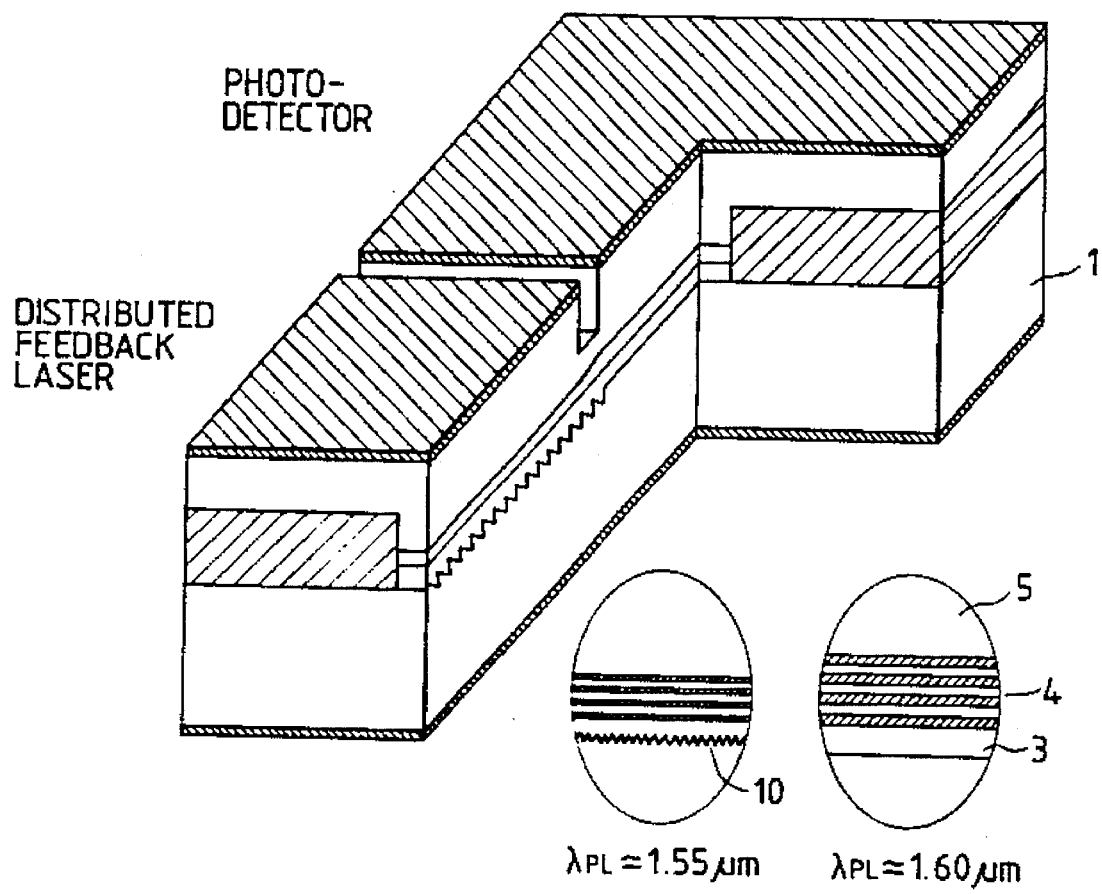
FIG. 13 is a perspective view of a variation of the semiconductor light emitting element manufactured by the fourth embodiment of the inventive manufacturing method.

FIG. 13 is a perspective view of a variation of the semiconductor photonic integrated circuit manufactured by the fourth embodiment of the inventive manufacturing method. The illustrated example involves diffraction grating 10 partially formed on the substrate 1. Over the n-InP substrate 1 covered with patterning masks, there are grown in crystals an InGaAsP waveguide layer 3, a quantum well structure 4 and a p-InP clad layer 5 successively by metal organic vapor phase epitaxy. The quantum well structure 4 comprises InGaAs well layers and InGaAsP barrier layers. As per the relationship in FIG. 4, the gain peak wavelengths are set to 1.55 μm and 1.60 μm where the mask widths are set to 100 μm and 180 μm, respectively. When this structure is divided for use into an active region and a photo-detecting region, these regions combine readily to constitute a photodetector integrated distributed feedback laser of high performance and high reliability.

Sixth Embodiment

Figure 14:
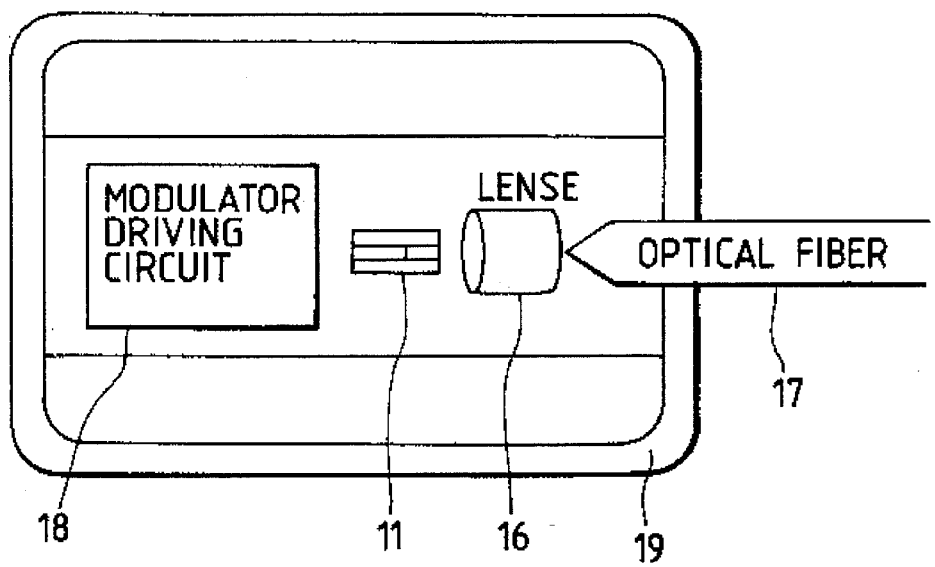
FIG. 14 is a schematic view showing the constitution of a transmitter module for photonic communication incorporating a semiconductor light emitting element manufactured according to this invention.

FIG. 14 is a schematic view showing the constitution of a transmitter module for photonic communication incorporating a semiconductor photonic integrated circuit manufactured according to this invention. In FIG. 14, the transmitter module 19 comprises a distributed feedback laser and optical modulator integrated device 11 as per the second embodiment, a spherical lens 16 located on the optical axis of the device 11, a ball-pointed fiber 17 fixed to the lens 16, and a modulator driving circuit 18. In operation, the transmitter module 19 for photonic communication readily provides high-speed transmission optical signals of high optical fiber output and low chirping characteristics.

Seventh Embodiment

Figure 15:
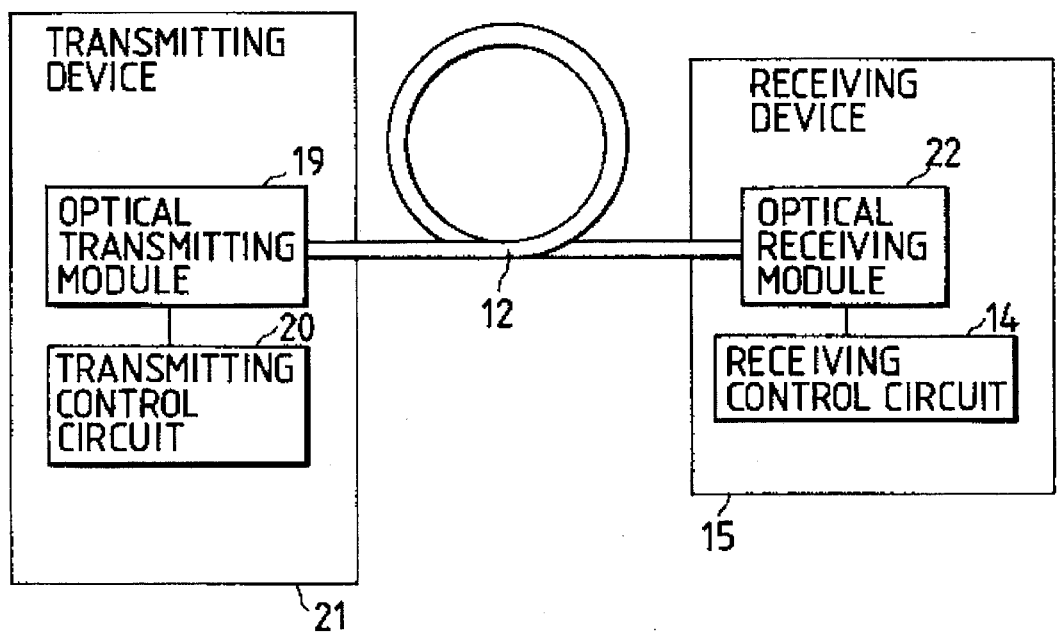
FIG. 15 is a schematic view depicting the constitution of an optical communication system incorporating semiconductor light emitting elements manufactured according to this invention.

FIG. 15 is a schematic view depicting the constitution of an optical communication system incorporating semiconductor photonic integrated circuits manufactured according to this invention. As shown FIG. 15, a transmitting device 21 incorporates an optical transmitting module 19 as per the sixth embodiment and a transmitting control circuit 20. Transmission optical signals from the transmitter module 19 reach a receiving device 15 by way of an optical fiber 12. The receiving device 15 comprises an optical receiving module 22 and a receiving control circuit 14. These devices combine to constitute an optical communication system used for a trunk line. In operation, the system readily permits non-relay optical transmissions over distances of 100 km or longer.

As many apparently different embodiments of this invention may be made without departing from the spirit and scope thereof, it is to be understood that the invention is not limited to the specific embodiments thereof except as defined in the appended claims.

What is claimed is:

1. A method of manufacturing a semiconductor photonic integrated circuit comprising a first and a second photonic device connected optically one another on a single semiconductor substrate and formed by a selective-area growth process, said selective-area growth process comprising the step of growing compound semiconductor layers constituting said first and said second photonic device, said first photonic device being formed in a particular area on said semiconductor substrate using a set of insulating film masks with an open space width therebetween, said open space width ranging from 1.0 to 0.125 times the vapor diffusion length of a group III species, the masks being arranged in parallel with an optical axis of said first photonic device, a width of each of the masks being in perpendicular relation to said optical axis and ranging from 16 to 800 μm, said second photonic device being formed without the use of said insulating film masks.

2. A method of manufacturing a semiconductor photonic integrated circuit according to claim 1, wherein said growing step further comprising forming a III–V group compound semiconductor layer.

3. A method of manufacturing a semiconductor photonic integrated circuit according to claim 2, wherein said growing step further comprises performing crystal growth by metal organic vapor phase epitaxy.

4. A method of manufacturing a semiconductor photonic integrated circuit according to claim 3, wherein said growing step further comprises forming a quantum well layer.

5. A method of manufacturing a semiconductor photonic integrated circuit according to claim 3, further comprising the steps of:

etching into mesa-stripes the growth layers deposited by said selective-area growth process; and forming current block layers by buried growth on both sides of each of said mesa-stripes.

6. A method of manufacturing a semiconductor photonic integrated circuit according to claim 1, where in said open space width ranges from 10 µm to 30 µm.

* * * * *

UNITED STATES PATENT AND TRADEMARK OFFICE
CERTIFICATE OF CORRECTION

PATENT NO. : 5,543,353
DATED : August 6, 1996
INVENTOR(S) : Makoto SUZUKI et al.

It is certified that error appears in the above-indentified patent and that said Letters Patent is hereby corrected as shown below:

| Column | Line | |
|---|---|---|
| 1 | 53 | Delete "it has been found that". |
| 4 | 47 | Change "d=A exp" to --d=Aexp--. |
| 6 | 10 | Change "mask width =0 μm)" to --mask width = 0 μm)--. |
| 6 | 12 | Change "On" to --On--. |
| 8 | 36 | After "shown" insert --in--. |
| 8 | 45 | Change "100 km" to --100 km--. |
| 9 | 5 | Change "comprising" to --comprises--. |
| 10 | 10 | Change "where in" to --wherein--. |

Signed and Sealed this

Twenty-first Day of January, 1997

Attest:

BRUCE LEHMAN

Attesting Officer     Commissioner of Patents and Trademarks